US007846786B2

United States Patent
Lee et al.

(10) Patent No.: US 7,846,786 B2
(45) Date of Patent: Dec. 7, 2010

(54) METHOD OF FABRICATING NANO-WIRE ARRAY

(75) Inventors: Hong Yeol Lee, Daejeon (KR); Seung Eon Moon, Daejeon (KR); Eun Kyoung Kim, Daejeon (KR); Jong Hyurk Park, Daejeon (KR); Kang Ho Park, Daejeon (KR); Jong Dae Kim, Daejeon (KR); Gyu Tae Kim, Seoul (KR); Jae Woo Lee, Seoul (KR); Hye Yeon Ryu, Seoul (KR); Jung Hwan Huh, Seoul (KR)

(73) Assignees: Korea University Industrial & Academic Collaboration Foundation, Seoul (KR); Electronics and Telecommunications Research Institute, Daejeon (KR)

( * ) Notice: Subject to any disclaimer, the term of this patent is extended or adjusted under 35 U.S.C. 154(b) by 98 days.

(21) Appl. No.: 11/927,881

(22) Filed: Oct. 30, 2007

(65) Prior Publication Data

US 2008/0233675 A1 Sep. 25, 2008

(30) Foreign Application Priority Data

Dec. 5, 2006 (KR) .................. 10-2006-0122349
Jun. 22, 2007 (KR) .................. 10-2007-0061440

(51) Int. Cl.
*H01L 21/00* (2006.01)
*H01L 21/16* (2006.01)
*H01L 29/06* (2006.01)
*H01L 27/088* (2006.01)

(52) U.S. Cl. .................. 438/151; 438/104; 257/24; 257/401; 977/762

(58) Field of Classification Search .................. 438/104, 438/151; 257/24, 401; 977/762
See application file for complete search history.

(56) References Cited

U.S. PATENT DOCUMENTS

| 7,049,625 | B2 | 5/2006 | Kern et al. | |
| 2005/0128788 | A1* | 6/2005 | Segal et al. | 365/151 |
| 2007/0145356 | A1* | 6/2007 | Amlani et al. | 257/40 |
| 2008/0210987 | A1* | 9/2008 | Bondavalli et al. | 257/253 |

FOREIGN PATENT DOCUMENTS

JP 6-252056 9/1994

(Continued)

OTHER PUBLICATIONS

Zhang et al., "Selective Etching of Metallic Carbon Nanotubes by Gas-Phase Reaction," Nov. 10, 2006, Science, vol. 314, pp. 974-977 plus supplemental pages.*

(Continued)

*Primary Examiner*—N Drew Richards
*Assistant Examiner*—Michael Jung
(74) *Attorney, Agent, or Firm*—Rabin & Berdo, P.C.

(57) ABSTRACT

Provided is a method of fabricating a nano-wire array, including the steps of: depositing a nano-wire solution, which contains nano-wires, on a substrate; forming a first etch region in a stripe shape on the substrate and then patterning the nano-wires; forming drain and source electrode lines parallel to each other with the patterned nano-wires interposed therebetween; forming a plurality of drain electrodes which have one end connected to the drain electrode line and contact at least one of the nano-wires, and forming a plurality of source electrodes, which have one end connected to the source electrode line and contact the nano-wires that contact the drain electrodes; forming a second etch region between pairs of the drain and source electrodes so as to prevent electrical contacts between the pairs of the drain and source electrodes; forming an insulating layer on the substrate; and forming a gate electrode between the drain and source electrodes contacting the nano-wires on the insulating layer. Accordingly, even in an unparallel structure of nano-wires to electrode lines, a large scale nano-wire array is practicable and applicable to an integrated circuit or display unit with nano-wire alignment difficulty, as well as to device applications using flexible substrates.

11 Claims, 8 Drawing Sheets

FOREIGN PATENT DOCUMENTS

| | | |
|---|---|---|
| JP | 2003-332266 | 11/2003 |
| JP | 2005-244240 | 9/2005 |
| JP | 2006-49459 | 2/2006 |
| JP | 2006-270107 | 10/2006 |
| JP | 2006-278505 | 10/2006 |
| KR | 20050064109 | 6/2005 |

OTHER PUBLICATIONS

Bachtold et al., Logic Circuits with Carbon nanotube Transistors, www.sciencemag.org, Science, vol. 294, Nov. 9, 2001, pp. 1317-1320.

* cited by examiner

METHOD OF FABRICATING NANO-WIRE ARRAY

CROSS-REFERENCE TO RELATED APPLICATION

This application claims priority to and the benefit of Korean Patent Application No. 2006-122349, filed Dec. 5, 2006, and No. 2007-61440, filed Jun. 22, 2007, the disclosure of which is incorporated herein by reference.

BACKGROUND

1. Field of the Invention

The present invention relates to nano-wire arrays, and more particularly, to a method of fabricating a nano-wire array, capable of implementing a large scale nano-wire array even when nano-wires are not arranged parallel to electrode lines by selectively etching the nano-wires on a substrate and patterning electrodes to be vertical to the electrode lines so as to increase the possibility of connecting the electrodes with the nano-wires.

The present invention has been produced from the work supported by the IT R&D program of MIC (Ministry of Information and Communication)/IITA (Institute for Information Technology Advancement) [2006-S-006-01, Components/Module technology for Ubiquitous Terminals] in Korea.

2. Discussion of Related Art

Since the advent of transistors in 1948 as an amplifying component using conductive activation in semiconductor crystalline organization, transistors have been widely being used in a variety of electronic applications. Especially, transistor arrays with pluralities of transistors are usefully employed in various fields such as memories or sensors.

FIG. 1 illustrates a cross-sectional view of a general metal-oxide-semiconductor field-effect transistor (MOSFET) and a disposition of DRAM cells in the form of a transistor array.

The left side of FIG. 1 shows a cross-sectional view of the MOSFET formed of a gate electrode coupled to a gate terminal (to which a gate voltage is applied), an insulating layer of $SiO_2$, a semiconductor body (or semiconductor substrate), and drain and source each connected to drain and source terminals. With the structure of MOSFET, when a bias voltage is set to the drain and source while inducing a channel between the drain and the source by applying a gate voltage to the gate, the MOSFET is turned on by charge flow through the channel.

In the meantime, a capacitor that may be coupled to the drain of the MOSFET accumulates charges flowing into the source and stores information by charge accumulation when the gate voltage is cut off.

The right side of FIG. 1 shows a transistor array where unit cells are arranged to include MOSFETs and capacitors.

The transistor array is a DRAM cell array having a structure able to store information represented in the binary codes of '1' and '0' as data. In finding information stored in the transistor array, the gate voltage is applied to the gate to generate the channel. If the unit cell stores data '1', charges flow out toward the source from the capacitor and then a sensor detects the charge flow to confirm the information.

With the recent development of semiconductor technology, MOSFETs are more scaled down and integrated than before. Specifically, since the discovery of a carbonic nano-tube by Iijima in 1991, numerous studies of nano-wires are being energetically conducted to improve the possibilities of practical applications and more advanced integrated circuits, by way of improving the patterning techniques using E-beam, ionic beam, X-ray, photolithography, and atomic force microscope (AFM).

It is impossible to identify a nano-wire with the naked eye because its diameter is less than several nano-meters and its length is several micrometers, but is visible through a specific instrument, such a scanning electron microscope (SEM). In order to use the nano-wires in an electronic device, it is necessary to align the nano-wires in a desired orientation. There are several ways of aligning the nano-wires, such as aligning the nano-wires by applying an electric field to a substrate, or laying the nano-wires along grooves formed in a substrate. As a way of directly fabricating a device without an additional step of aligning the nano-wires, there is a method of forming electrodes by means of the E-beam lithography along orientations of laying the nano-wires after finding the positions and orientations of the nano-wires by the SEM.

The nano-wires are not suitable for use in practical electronic devices or for mass-production, because they are insufficient in the characteristics of alignment selectivity and electromagnetism. Therefore, regularizing the nano-wires' orientation is one of important factors in the field of nano-tube technologies. Until now, even with various ways of aligning the nano-wires, a way of aligning the nano-wires in parallel along a united orientation has still not been proposed. Accordingly, it is difficult to mass-produce devices with the nano-wires.

SUMMARY OF THE INVENTION

The present invention is directed to a method of fabricating a nano-wire array on a large scale even though nano-wires are unable to be aligned in parallel with electrode lines.

One aspect of the present invention provides a method of fabricating a nano-wire array, comprising the steps of: (a) depositing a nano-wire solution, which contains nano-wires, on a substrate; (b) forming a first etch region in a stripe shape on the substrate and then patterning the nano-wires; (c) forming drain and source electrode lines parallel to each other with the patterned nano-wires interposed therebetween; (d) forming a plurality of drain electrodes which have one end connected to the drain electrode line and contact at least one of the nano-wires, and forming a plurality of source electrodes, which have one end connected to the source electrode line and contact the nano-wires that contact the drain electrodes; (e) forming a second etch region between pairs of the drain and source electrodes so as to prevent electrical contacts between the pairs of the drain and source electrodes; (f) forming an insulating layer on the substrate; and (g) forming a gate electrode between the drain and source electrodes contacting the nano-wires on the insulating layer.

In this method, the nano-wires may be formed of one of ZnO, GaN, $SnO_2$, $In_2O_3$, $V_2O_5$, and $SiO_2$. The drain and source electrode lines, and the drain and source electrodes may be formed of one of Ti, Al, Ag, Au, and Pt.

In this method, the nano-wire solution may be made by mixing a plurality of nano-wires with an organic solvent. The organic solvent may comprise alcohol or isopropyl-alcohol.

In this method, steps (b) and (e) may be carried out by anisotropic etching using E-beam lithography. The drain and source electrode lines, and the drain and source electrodes may be formed by E-beam lithography.

In this method, step (c) may comprise partially etching the nano-wires between the drain and source electrode lines. The etching may be anisotropically carried out by E-beam lithography.

In step (d), the drain and source electrodes may be each vertically connected to the drain and source electrode lines and each length of the drain and source electrodes may be longer than a half of the distance between the drain and source electrode lines.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. Therefore, the following embodiments are described in order for this disclosure to be complete and enabling to those of ordinary skill in the art.

FIGS. 2 through 10 illustrate a method of fabricating a nano-wire array according to the present invention.

Figure 1:
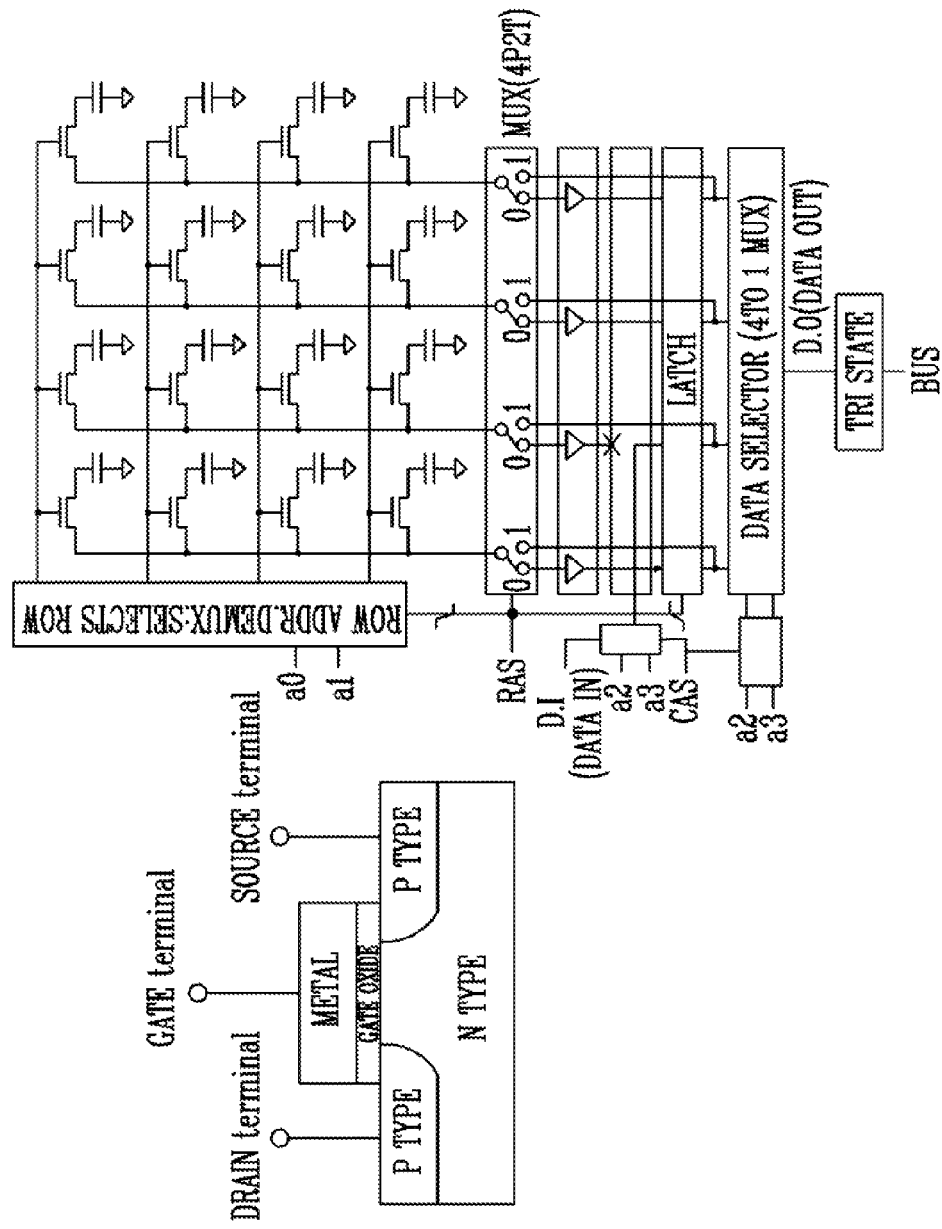
FIG. 1 illustrates a cross-sectional view of a general MOSFET and a disposition of DRAM cells in the form of a transistor array.
Figure 2:
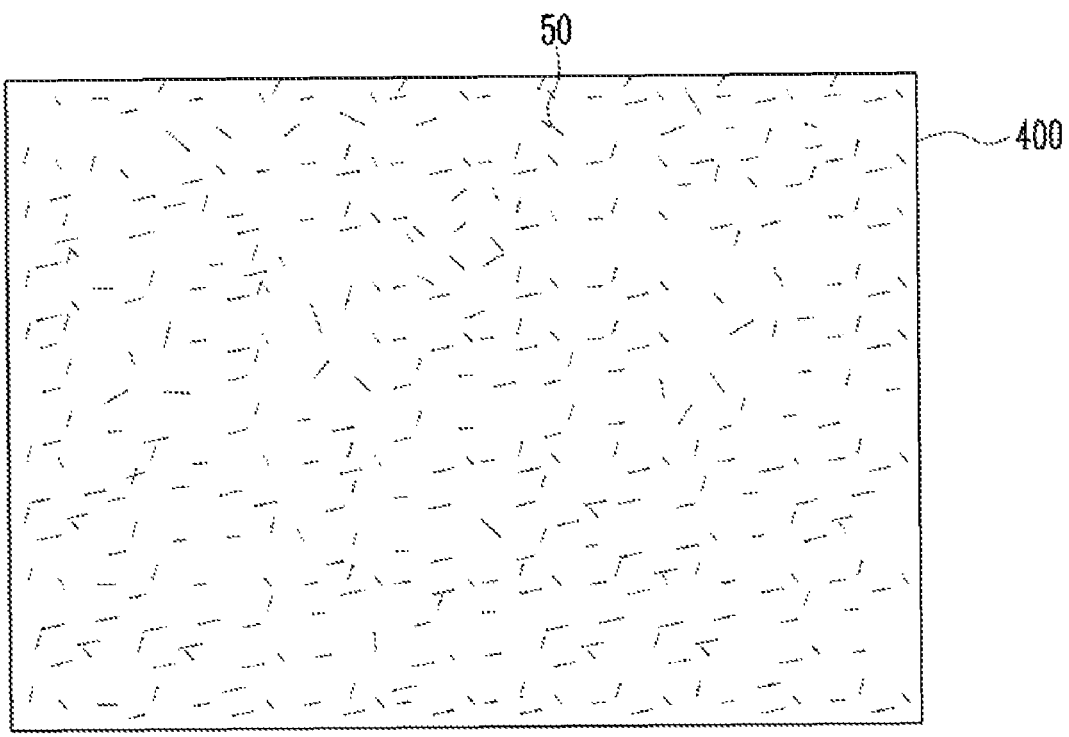
FIGS. 2 through 10 illustrate a method of fabricating a nano-wire array according to the present invention.

Referring to FIG. 2, to provide the nano-wire array according to the present invention, a substrate 400 is first prepared. Next, after making a nano-wire solution from mixing nano-wires 50 with an organic solvent, the nano-wire solution is deposited on the substrate 400. The substrate 400 is a silicon substrate. While it is preferred to set the concentration of the nano-wires 50 basically to one per unit cell, the concentration is controlled by adjusting a quantity of the nano-wire solution to individually disperse the nano-wires 50 for increasing an amount of current. The organic solvent of the nano-wire solution is comprised of alcohol or isopropyl-alcohol, which rapidly leaves only the nano-wires 50 after depositing the nano-wire solution on the substrate 400. It is ideal for the nano-wires 50 to be deposited thereon at the highest degree, but it is not necessary to have complete parallelization of all the nano-wires. The nano-wires 50 are made of one of ZnO, GaN, $SnO_2$, $In_2O_3$, $V_2O_5$, and $SiO_2$.

Figure 3A:
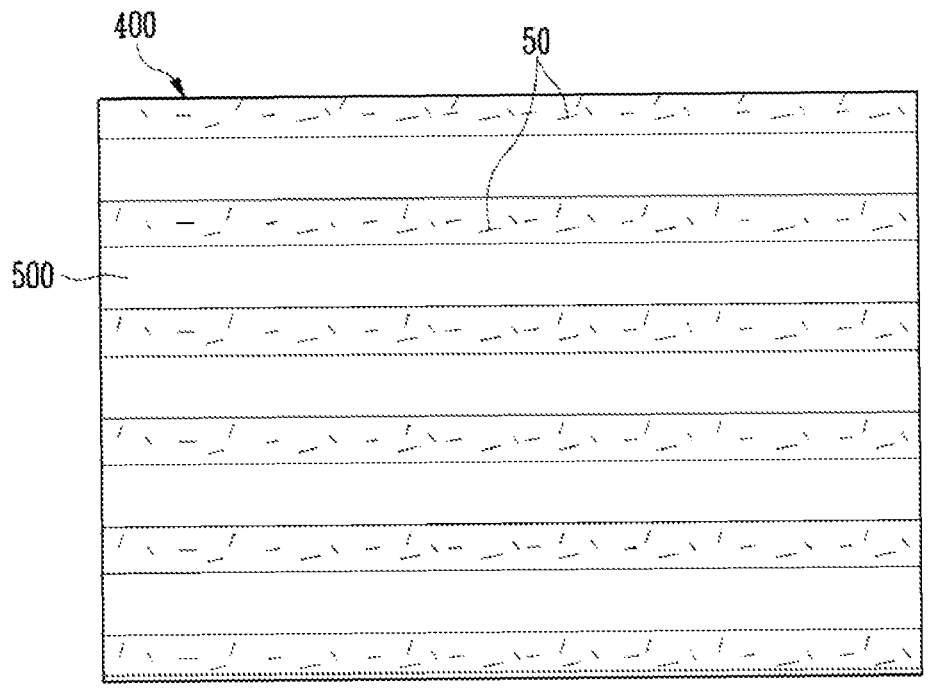
Figure 3B:
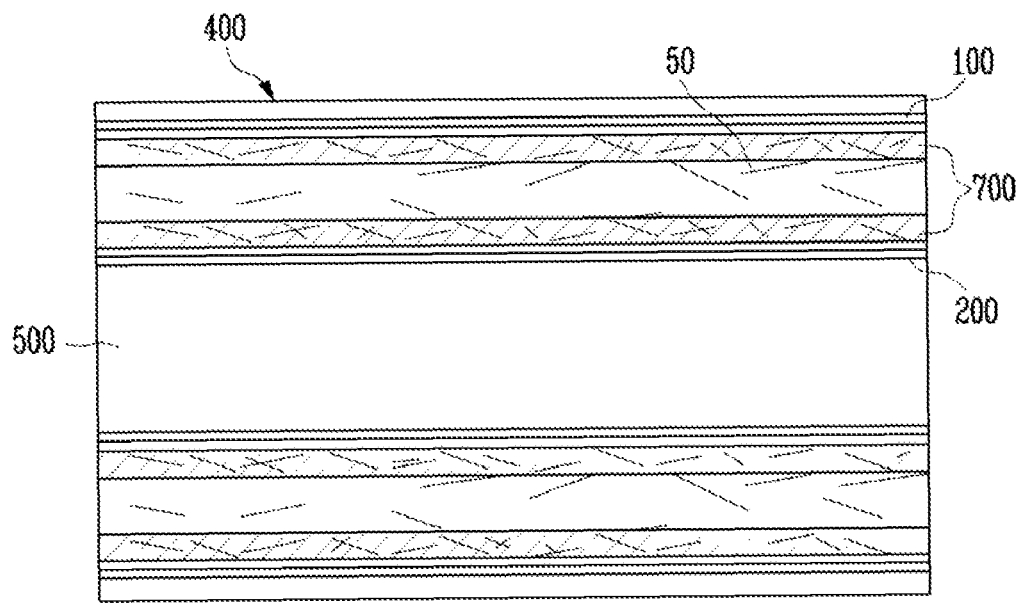
Figure 4:
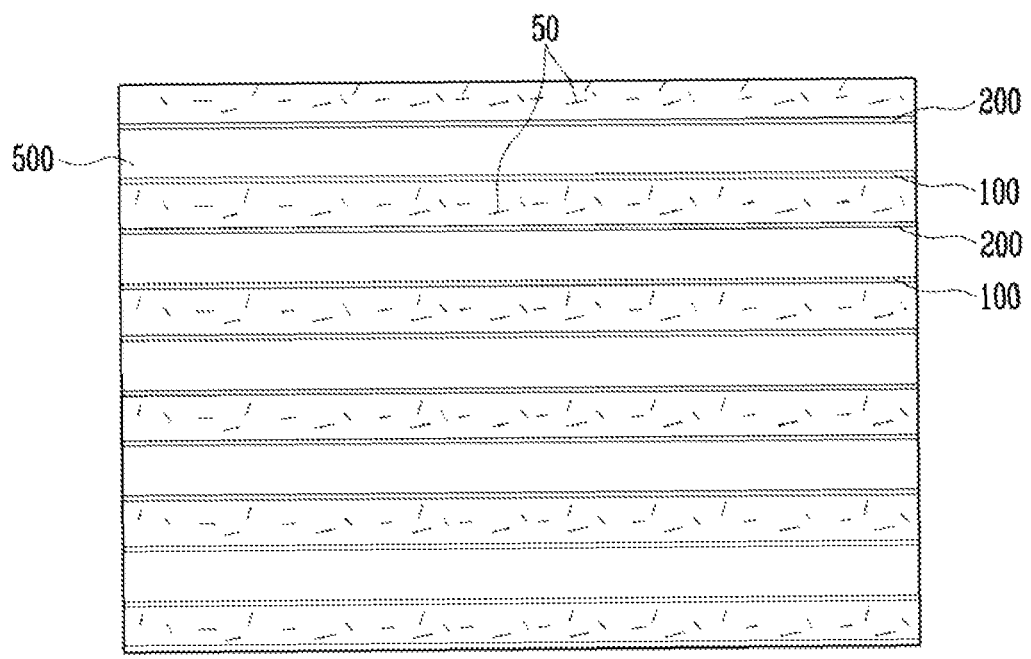

Then, referring to FIG. 3, the substrate 400 is selectively exposed by patterning the nano-wires formed on the substrate 400 in a stripe shape. For this nano-wire pattern, an electron-beam patterning technique is used such that: first, an E-beam resist (ER; not shown) is coated on the substrate 400; after exposing first etch regions 500 with stripes by means of an electron beam of E-beam lithography equipment, anisotropic etching is carried out with reactive gas in the mechanism of ionic collision using reactive ion etching (RIE); and the remaining ER removed, and thus the substrate from which only the first etch regions 500 are etched is formed. During this, the first etch regions 500 may be controlled in width according to the density of the nano-wires 50.

In the next step, referring to FIG. 4A, drain and source electrode lines 100 and 200 are formed parallel to each other in the first etch regions 500 by means of the E-beam patterning technique. In detail, first, an ER (not shown) is coated on the substrate 400 patterned in a stripe shape. After patterning the regions of the drain and source electrode lines 100 and 200 on the ER by means of an electron beam of the E-beam lithography equipment, a developing process is carried out to remove the regions exposed to the electron beam, and then the drain and source electrode lines 100 and 200 are formed thereon. Then, after removing the remaining ER therefrom by means of a lift-off process, the drain and source electrode lines 100 and 200 are left on the regions exposed to the electron beam. Referring to FIG. 4B, unless the nano-wires 50 are uniformly distributed, a region 500 crowded by the nano-wires 50 is additionally etched to enable selective contacts between the nano-wires 50 and electrodes that will be formed later.

Figure 5:
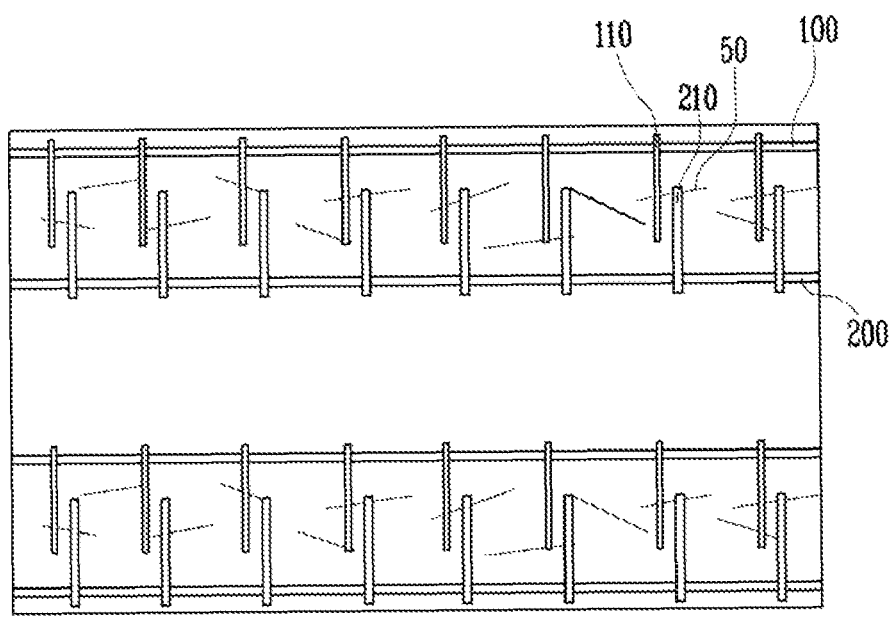

Thereafter, referring to FIG. 5, drain and source electrodes 110 and 210 are formed. One end of the drain electrode 110 is connected to the drain electrode line 100, while one end of the source electrode 210 is connected to the source electrode line 200. In this embodiment, the drain and source electrodes 110 and 210 are vertical to the drain and source electrode lines 100 and 200, respectively. If a length of the drain electrode 110 or the source electrode 210 is set to be longer than a half distance between the drain and source electrode lines 100 and 200, it raises the possibility of simultaneously connecting a single one of the nano-wires 50 to a pair of the drain electrode 110 and the source electrode 210. In other words, the nano-wires 50 are required to be laid over the drain and source electrodes 110 and 210. The drain and source electrodes 110 and 210 are repeatedly formed in a uniform distance along the drain and source electrode lines 100 and 200. The distance and cross range between the drain and source electrodes 110 and 210 may be adjusted in accordance with the density of the nano-wires 50.

Forming the drain and source electrodes 110 and 210 is accomplished by the E-beam patterning technique, as in the process for the drain and source electrode lines 100 and 200. The drain and source electrode lines 100 and 200, and the drain and source electrodes 110 and 210, are formed of Ti, Al, Ag, Au, or Pt.

Figure 6:
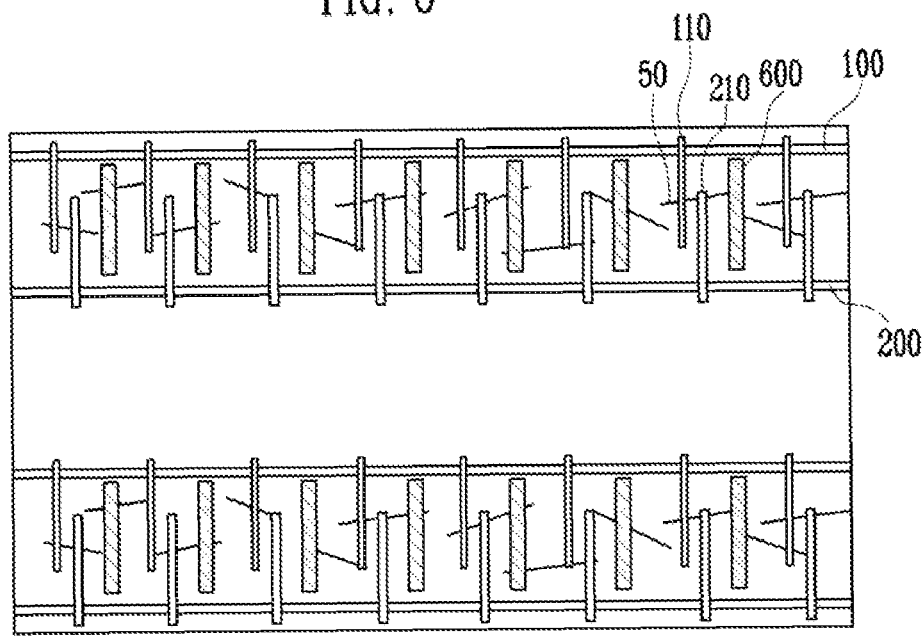
Figure 7:
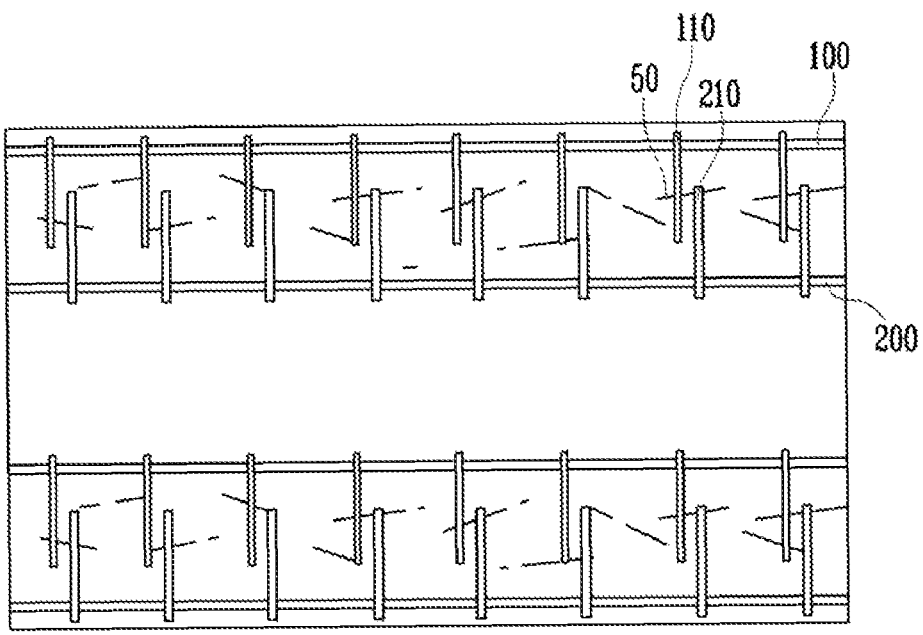

Next, referring to FIG. 6, second etch regions 600 are formed to provide patterns between the drain and source electrodes 110 and 210 on the substrate 400 for the purpose of preventing electrical short circuits between cells. After removing the second etch regions 600 from the substrate 400, the nano-wires 50 are partially etched away between the drain and source electrodes 110 and 210. This etching process is anisotropically carried out by means of the E-beam patterning technique. FIG. 7 shows a result after partially etching the nano-wires 50. Referring to FIG. 7, due to partial removing of the nano-wires 50 between the cells while etching the second etching regions 600, there is no electrical short circuit between the drain and source electrodes 110 and 210.

Figure 8:
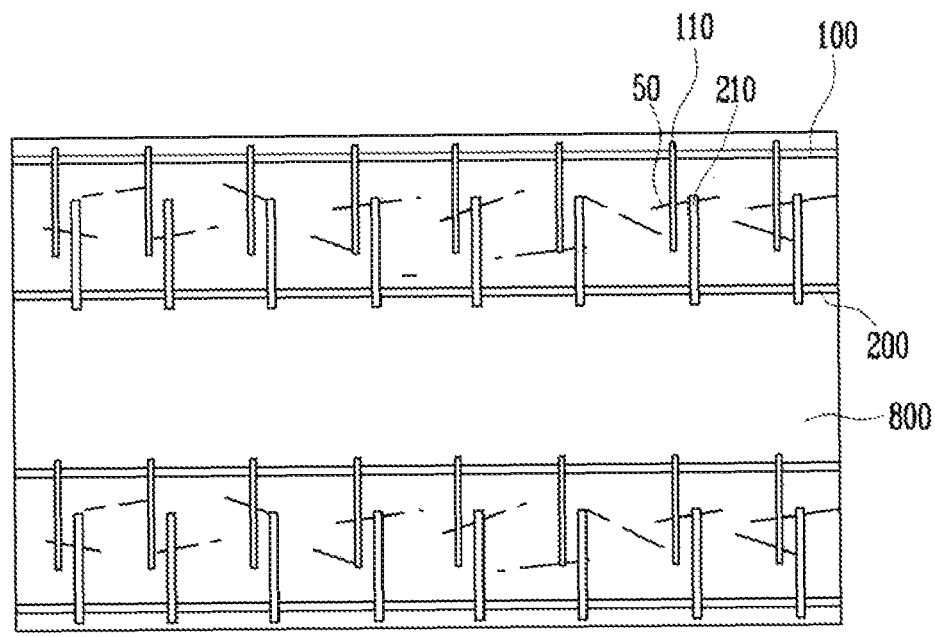

Then, referring to FIG. 8, an insulating layer 800 is formed on the substrate including channels by the nano-wires 50. The insulating layer 800 is made of oxide.

Figure 9:
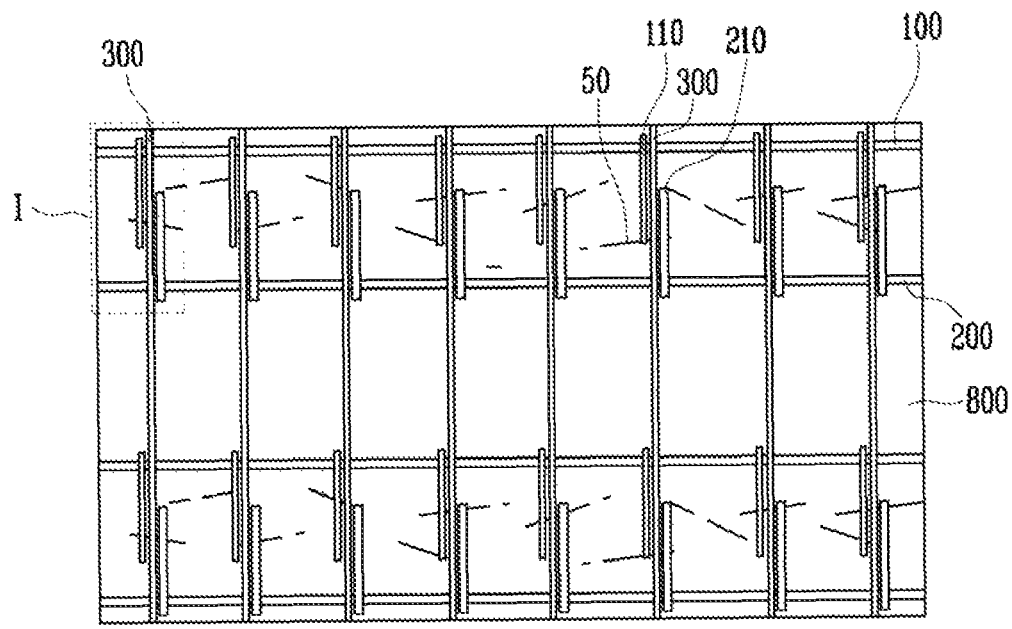
Figure 10:
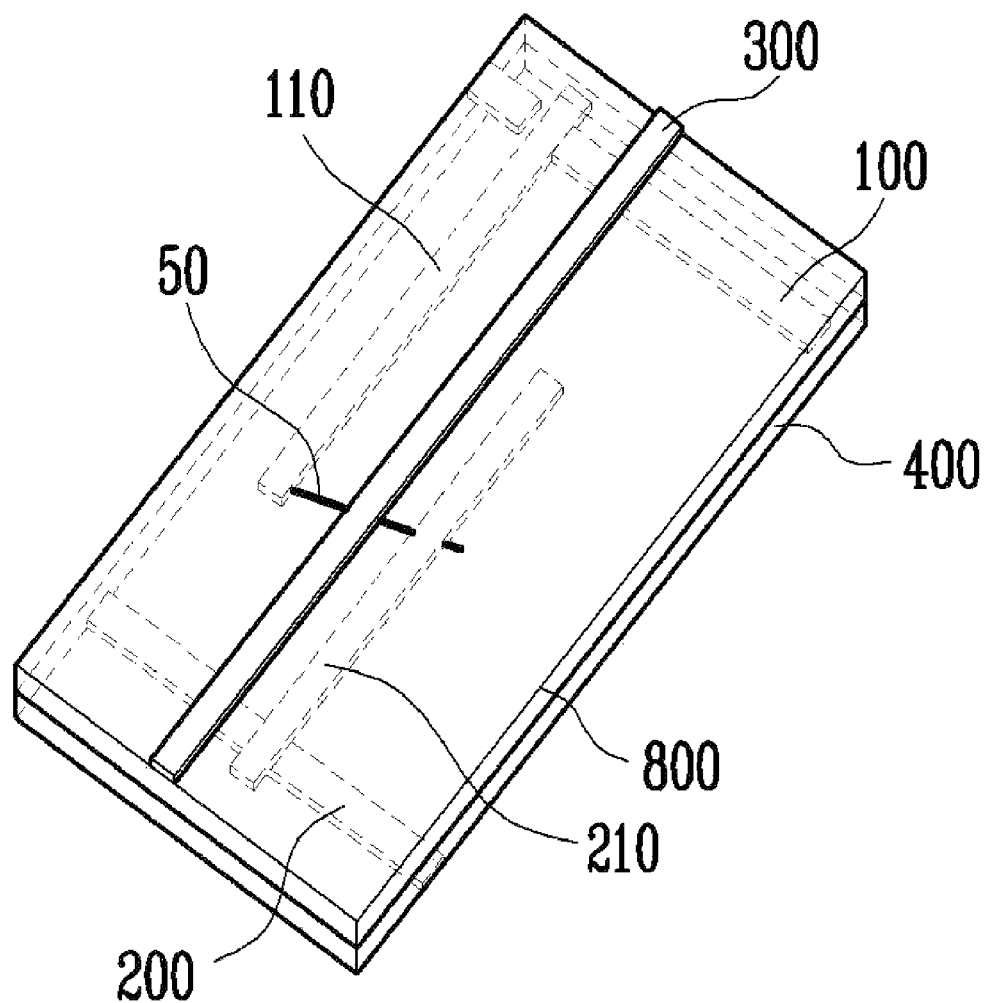

Thereafter, referring to FIGS. 9 and 10, gate electrodes 300 are formed on the insulating layer 800. During this process, the gate electrodes 300 are interposed between the drain and source electrodes 110 and 2 10 on the insulating layer 800. The gate electrodes 300 function to electrically control the nano-wire channels of the cells. FIG. 10 is a perspective view enlarging the region I corresponding to a single cell as a part of the nano-wire array.

Figure 11:
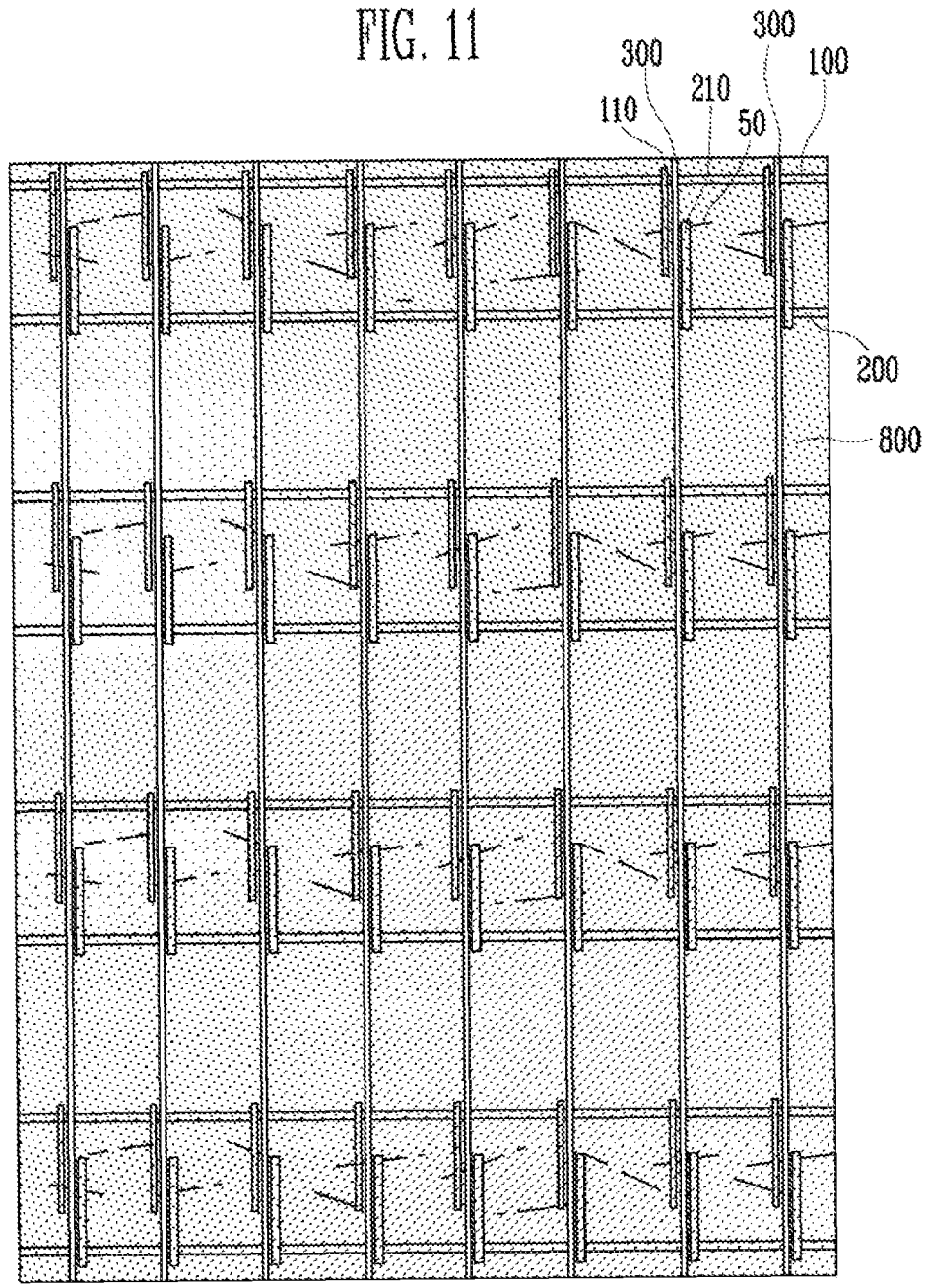
FIG. 11 illustrates a complete structure of the nano-wire array according to an exemplary embodiment of the present invention.

FIG. 11 illustrates a complete structure of the nano-wire array on a large scale, which is fabricated by a processing method according to an embodiment of the present invention.

Referring to FIG. 11, in the nano-wire array according to the present invention, there are a plurality of transistors each including drain and source electrodes each electrically connected to drain and source electrode lines on a single substrate, a nano-wire acting as a channel electrically connected between the drain and source electrodes, and a gate electrode formed over the nano-wire, i.e., between the drain and source electrodes. According to FIG. 11, it is possible to mass-produce the nano-wire arrays by forming the transistors after depositing the nano-wires on the entire surface of the substrate.

According to the present invention, it is possible to implement a large scale nano-wire array even if the nano-wires are not parallel to electrode lines. Thus, the present invention is applicable to an integrated circuit device or display unit with nano-wire alignment difficulty. Moreover, the present invention is also useful for device applications of flexible substrates.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of fabricating a nano-wire array, comprising the steps of:
   (a) depositing a nano-wire solution, which contains nano-wires, on a substrate;
   (b) forming a first etch region in a stripe shape on the substrate and then patterning the nano-wires;
   (c) forming drain and source electrode lines parallel to each other with the patterned nano-wires interposed therebetween;
   (d) forming a plurality of drain electrodes which have one end connected to the drain electrode line and contact at least one of the nano-wires, and forming a plurality of source electrodes which have one end connected to the source electrode line and contact the nano-wires that contact the drain electrodes;
   (e) forming a second etch region on the substrate between pairs of the drain and source electrodes, the second etch region having such a size that any nano-wire electrically connecting between the pairs of the drain and source electrodes has at least a portion disposed within the second etch region, and etching away the second etch region from the substrate, wherein all of nano-wires that have a part within the second etch region are cut with said part being removed after the etching of the second region, thereby preventing the nano-wires from connecting the pairs of the drain and source electrodes;
   (f) forming an insulating layer on the substrate; and
   (g) forming a gate electrode between the drain and source electrodes contacting the nano-wires on the insulating layer,
   wherein:
   the pairs of the source and drain electrodes includes a first pair including a first drain electrode and a first source electrode and a second pair including a second drain electrode and a second source electrode, such that the first drain electrode, the first source electrode, the second drain electrode and the second source electrode are disposed on the substrate from left to right in this order; and all intervening nano-wire that electrically connect the first source electrode and the second drain electrode before the step (e) are etched away after the step (e), such that each part of the all intervening nano-wires that is disposed in the second etch region is removed.

2. The method of claim 1, wherein the nano-wires are formed of one of ZnO, GaN, $SnO_2$, $In_2O_3$, $V_2O_5$, and $SiO_2$.

3. The method of claim 1, wherein the drain and source electrode lines, and the drain and source electrodes are formed of one of Ti, Al, Ag, Au, and Pt.

4. The method of claim 1, wherein the nano-wire solution is made by mixing a plurality of nano-wires with an organic solvent.

5. The method of claim 4, wherein the organic solvent comprises alcohol or isopropyl-alcohol.

6. The method of claim 1, wherein steps (b) and (e) are carried out by anisotropic etching using E-beam lithography.

7. The method of claim 1, wherein the drain and source electrode lines, and the drain and source electrodes are formed by E-beam lithography.

8. The method of claim 1, wherein step (c) further comprises: partially etching the nano-wires between the drain and source electrode lines.

9. The method of claim 8, wherein the etching is anisotropic etching using E-beam lithography.

10. The method of claim 1, wherein in step (d), the drain and source electrodes are each vertically connected to the drain and source electrode lines and each length of the drain and source electrodes is longer than a half of the distance between the drain and source electrode lines.

11. A method of fabricating a nano-wire array, comprising the steps of:
   (a) depositing a nano-wire solution, which contains nano-wires, on a substrate;
   (b) forming a first etch region in a stripe shape on the substrate and then patterning the nano-wires;
   (c) forming drain and source electrode lines parallel to each other with the patterned nano-wires interposed therebetween;
   (d) forming a plurality of drain electrodes which have one end connected to the drain electrode line and contact at least one of the nano-wires, and forming a plurality of source electrodes which have one end connected to the source electrode line and contact the nano-wires that contact the drain electrodes;
   (e) forming a second etch region on the substrate between pairs of the drain and source electrodes, the second etch region having such a size that any nano-wire electrically connecting between the pairs of the drain and source electrodes has at least a portion disposed within the second etch region, and anisotropically etching away the second etch region from the substrate, wherein all of nano-wires that have a part within the second etch region are cut with said part being removed after the etching of the second region, thereby preventing the nano-wires from connecting the pairs of the drain and source electrodes;
   (f) forming an insulating layer on the substrate; and
   (g) forming a gate electrode between the drain and source electrodes contacting the nano-wires on the insulating layer.

* * * * *